United States Patent
Yoshizawa

(10) Patent No.: US 8,802,217 B2
(45) Date of Patent: Aug. 12, 2014

(54) TILT STRUCTURE

(75) Inventor: Takahiko Yoshizawa, Sakata (JP)

(73) Assignee: Seiko Epson Corporation, Tokyo (JP)

(*) Notice: Subject to any disclaimer, the term of this patent is extended or adjusted under 35 U.S.C. 154(b) by 710 days.

(21) Appl. No.: 13/072,127

(22) Filed: Mar. 25, 2011

(65) Prior Publication Data
US 2011/0244190 A1    Oct. 6, 2011

(30) Foreign Application Priority Data
Apr. 5, 2010  (JP) ................. 2010-086767

(51) Int. Cl.
*B32B 3/00* (2006.01)
(52) U.S. Cl.
USPC ....................................................... 428/166
(58) Field of Classification Search
USPC .............. 428/166; 257/415, E21.52, E29.324
See application file for complete search history.

(56) References Cited

U.S. PATENT DOCUMENTS

| | | |
|---|---|---|
| 7,728,395 B2* | 6/2010 | Yang et al. ............... 257/415 |
| 2011/0215432 A1 | 9/2011 | Uematsu et al. |
| 2011/0216315 A1 | 9/2011 | Uematsu et al. |

FOREIGN PATENT DOCUMENTS

| | | |
|---|---|---|
| JP | A-06-129908 | 5/1994 |
| JP | A-2001-511264 | 8/2001 |
| JP | A-2010-030021 | 2/2010 |
| WO | WO 98/35258 | 8/1998 |
| WO | WO 2009/124605 A2 | 10/2009 |

* cited by examiner

*Primary Examiner* — Catherine A Simone
(74) *Attorney, Agent, or Firm* — Oliff PLC

(57) ABSTRACT

A tilt structure includes a shaft section formed on a substrate section, a tilt structure film having one end formed on an upper surface of the shaft section, and the other end bonded to the substrate section, and a thin film section provided to the tilt structure film, located on a corner section composed of the upper surface of the shaft section and a side surface of the shaft section, and having a film thickness thinner than the tilt structure film, the tilt structure film is bent in the thin film section, and an acute angle is formed by the substrate section and the tilt structure film.

1 Claim, 11 Drawing Sheets

TILT STRUCTURE

The entire disclosure of Japanese Patent Application No. 2010-086767, filed Apr. 5, 2010, is expressly incorporated by reference herein.

TECHNICAL FIELD

The present invention relates to a minute tilt structure, a method of manufacturing a tilt structure, and a spectral filter and a spectral sensor using the tilt structure.

BACKGROUND ART

In the field of medical care, agriculture, environment, and so on, there are used spectral sensors in order for performing diagnostics and inspection of an object. For example, in the field of medical care, there are used pulse oximeters for measuring the blood oxygen saturation level using light absorption by hemoglobin. Further, in the field of agriculture, there are used Brix meters for measuring the sugar content of fruits using light absorption by sugar.

In the patent document 1 described below, there is disclosed a spectral image sensor for limiting the incident angle with an optical fiber for optically connecting an interference filter and a photoelectric conversion element to each other to thereby limit the transparent wavelength band to the photoelectric conversion element.

Incidentally, the spectral sensor in the related art is difficult to miniaturize. In order for manufacturing a small-sized spectral sensor, it is required to form a minute tilt structure. Further, although the minute tilt structure is often required in the spectral filter used for a high performance optical device, it is difficult to manufacture the minute tilt structure.

Further, if the minute tilt structure can be manufactured, it is possible to use the minute tilt structure for various purposes besides the spectral sensor.

In the related art technology, the minute tilt structure is manufactured using a metal mold. However, if the minute tilt structure is manufactured using the metal mold, there arise the following problems. (1) Since it costs a large amount of money to manufacture a metal mold, large initial investment becomes necessary, and the manufacturing cost of the tilt structure increases. (2) Since the metal mold is worn away with the repeated use of the metal mold, regular replacement by purchase becomes necessary, and running cost increases. (3) Since it is necessary to newly manufacture the metal mold also in the case of a minor change in geometry of the tilt structure, not only increase in cost but also a long period of time for manufacturing the metal mold becomes necessary. (4) As a feature of the metal mold, the material of the tilt structure is limited to the material (e.g., resin), which can be molded by the metal mold. (5) Since the limitation of miniaturization of the metal mold corresponds to the limitation of miniaturization of the tilt structure, it is difficult to manufacture a minute tilt structure. (6) Since a highly accurate bonding technology or the like is required in the case in which it is attempted to integrate the tilt structure and a semiconductor element, integration with the semiconductor element is difficult.

RELATED ART DOCUMENT

Patent Document

[Patent Document 1] JP-A-6-129908

SUMMARY OF THE INVENTION

Problem that the Invention is to Solve

In the related art technology, it has been difficult to manufacture the minute tilt structure.

The invention is made in view of this technical problem. Some of the aspects of the invention relate to a minute tilt structure, a method of manufacturing a tilt structure, and a spectral filter and a spectral sensor using the tilt structure.

Means for Solving the Problem

In some aspects of the invention, a tilt structure includes a shaft section formed on a substrate section, a tilt structure film having one end formed on an upper surface of the shaft section, and the other end bonded to the substrate section, and a thin film section provided to the tilt structure film, located on a corner section composed of the upper surface of the shaft section and a side surface of the shaft section, and having a film thickness thinner than the tilt structure film, the tilt structure film is bent in the thin film section, and an acute angle is formed by the substrate section and the tilt structure film.

In another aspect of the invention, a tilt structure includes a shaft section formed on a substrate section, a thin film having one end formed on an upper surface of the shaft section, and the other end bonded to the substrate section, and a tilt structure film formed on the thin film, and having a film thickness thicker than the thin film, the tilt structure film is formed on the other end of the thin film instead of a corner section composed of the upper surface of the shaft section and a side surface of the shaft section, the thin film is bent on the corner section, and an acute angle is formed by the substrate section and both of the thin film and the tilt structure film.

In another aspect of the invention, a tilt structure includes a narrow shaft section formed on a substrate section, and a tilt structure film having one end formed on an upper surface of the narrow shaft section, having the other end bonded to the substrate section, and having a film thickness thicker than a width of the narrow shaft section, the narrow shaft section is bent, and an acute angle is formed by the substrate section and the tilt structure film.

In another aspect of the invention, a tilt structure includes a narrow shaft section formed on a substrate section, and a tilt structure film formed on an upper surface of the narrow shaft section, and having a width larger than a width of the narrow shaft section, a bottom section formed on the substrate section, and opposed to the narrow shaft section, and a base section, which is provided to the upper surface of the bottom section, and to which an upper portion of the tilt structure film is bonded, the narrow shaft section is bent, and an acute angle is formed by the base section and the tilt structure film.

In another aspect of the invention, a spectral filter is a filter adapted to limit a wavelength of light using the tilt structure according to any one of the aspects described above.

In another aspect of the invention, a spectral sensor includes an angle control filter adapted to control an incident angle of light passing, the spectral filter described above adapted to limit the wavelength of the light, which can be transmitted through the angle control filter, and a light receiving element adapted to detect light transmitted through the angle control filter and the spectral filter.

In another aspect of the invention, a method of manufacturing a tilt structure includes forming a shaft section on a substrate section, forming a sacrificial film, from which an upper surface of the shaft section is exposed, and which has an upper surface continuous to the upper surface of the shaft section, on the substrate section, providing a tilt structure film to the upper surface of the shaft section and the upper surface of the sacrificial film, providing a thin film section located on a corner section composed of the upper surface of the shaft section and a side surface of the shaft section to the tilt structure film by processing the tilt structure film located on the corner section so as to have a thin film thickness, removing the sacrificial film between the tilt structure film and the substrate section, supplying a space between the tilt structure film and the substrate section with a fluid, removing the fluid to thereby bend the tilt structure film in the thin film section, and bonding an end of the tilt structure film to the substrate section to thereby form an acute angle by the substrate section and the tilt structure film.

According to this aspect, the semiconductor process can be used, and it becomes easy to manufacture a minute tilt structure.

In another aspect of the invention, a method of manufacturing a tilt structure includes forming a shaft section on a substrate section, forming a sacrificial film, from which an upper surface of the shaft section is exposed, and which has an upper surface continuous to the upper surface of the shaft section, on the substrate section, providing a thin film to the upper surface of the shaft section and the upper surface of the sacrificial film, forming a tilt structure film on the thin film, exposing the sacrificial film by processing the tilt structure film and the thin film, exposing the thin film located on a corner section composed of the upper surface of the shaft section and a side surface of the shaft section by removing the tilt structure film located on the corner section, removing the sacrificial film between the thin film and the substrate section, supplying a space between the thin film and the substrate section with a fluid, removing the fluid to thereby bend the thin film on the corner section, and bonding an end of the thin film to the substrate section to thereby form an acute angle by the substrate section and both of the thin film and the tilt structure film.

In another aspect of the invention, a method of manufacturing a tilt structure includes forming a narrow shaft section on a substrate section, forming a sacrificial film, from which an upper surface of the narrow shaft section is exposed, and which has an upper surface continuous to the upper surface of the narrow shaft section, on the substrate section, providing a tilt structure film, which has a film thickness thicker than a width of the narrow shaft section, to the upper surface of the narrow shaft section and the upper surface of the sacrificial film, removing the sacrificial film between the tilt structure film and the substrate section, supplying a space between the tilt structure film and the substrate section with a fluid, removing the fluid to thereby bend the narrow shaft section, and bonding an end of the tilt structure film to the substrate section to thereby form an acute angle by the substrate section and the tilt structure film.

In another aspect of the invention, a method of manufacturing a tilt structure includes forming a narrow shaft section and a bottom section opposed to the narrow shaft section on a substrate section, forming a sacrificial film, from which an upper surface of each of the narrow shaft section and the bottom section is exposed, and which has an upper surface continuous to the upper surface of each of the narrow shaft section and the bottom section, on the substrate section, providing a tilt structure film, which has a film thickness thicker than a width of the narrow shaft section, to the upper surface of the narrow shaft section and the upper surface of the sacrificial film, and providing an upper surface of the bottom section with a base section opposed to the tilt structure film, removing the sacrificial film between the narrow shaft section and the bottom section, and between the tilt structure film and the substrate section, supplying a space between the tilt structure film and the base section and a space between the narrow shaft section and the bottom section with a fluid, removing the fluid to thereby bend the narrow shaft section, and bonding an upper portion of the tilt structure film to the base section to thereby form an acute angle by the base section and the tilt structure film.

MODE FOR CARRYING OUT THE INVENTION

Hereinafter, embodiments of the invention will be described in detail. It should be noted that the present embodiments described below do not unreasonably limit the contents of the invention as described in the appended claims. Further, it is not necessarily true that all of the constituents explained in the present embodiments are essential as the means for solving the problem of the invention. Further, the same constituents are provided with the same reference symbols, and the explanation therefor will be omitted.

1. First Embodiment

FIGS. 1 through 3 are cross-sectional views showing a method of manufacturing a tilt structure according to the first embodiment of the invention. This method of manufacturing the tilt structure is a method of applying a semiconductor process technology to thereby make it easy to achieve low cost and miniaturization.

Firstly, a first material film 13, which constitutes a shaft section material and a substrate material, is deposited (FIG. 1A) on a base member (not shown).

Subsequently, a resist film 15 is formed on the first material film 13, and an etching process is performed on the first material film 13 using the resist film 15 as a mask to thereby form (FIG. 1B) a shaft section 13b on a substrate section 13a.

Figure 1A:
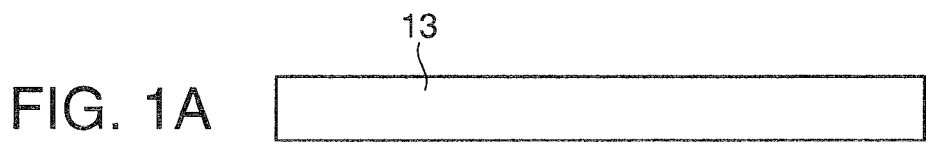
FIGS. 1A through 1F are cross-sectional diagrams showing a method of manufacturing a tilt structure according to a first embodiment.
Figure 1B:
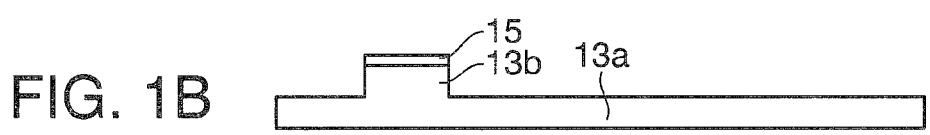
Figure 1C:
Figure 1D:
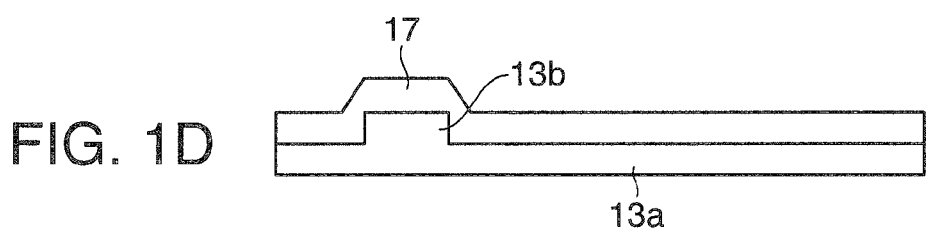

Subsequently, the resist film 15 is removed (FIG. 1C).

Then, a sacrificial film 17 is deposited (FIG. 1D) on the substrate section 13a and the shaft section 13b.

Figure 1E:
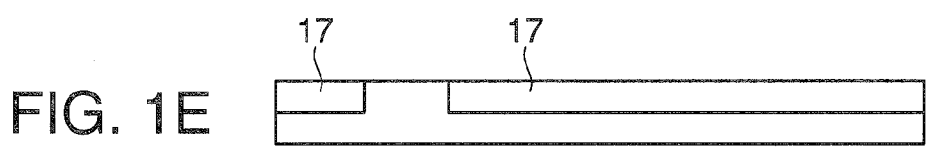
Figure 1F:
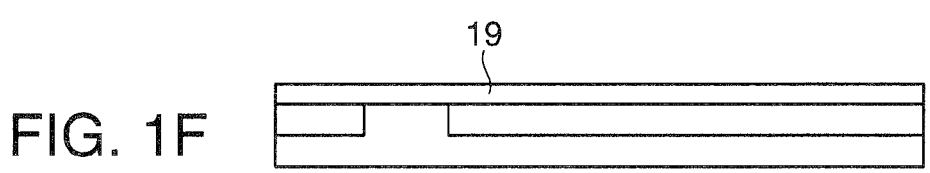

Subsequently, the sacrificial film 17 is planarized by chemical mechanical polishing (CMP) to thereby expose the upper surface of the shaft section 13b, and thus form the sacrificial film 17, which has the upper surface continuous to the upper surface of the shaft section 13b, on the substrate section 13a (FIG. 1E). It should be noted that if the sacrificial film 17 can be formed in the condition shown in FIG. 1E only by applying it on the substrate section 13a and the shaft section 13b, the process of planarizing it by CMP is unnecessary. As such a sacrificial film 17, it is possible to adopt, for example, a spin-on glass (SOG) film, an organic film, and a resist film.

Then, a second material film 19, which forms the tilt structure film, is deposited (FIG. 1F) on the upper surface of the shaft section 13b and the upper surface of the sacrificial film 17.

Subsequently, a resist film 21 is formed on the second material film 19, and the etching process is performed on the second material film 19 using the resist film 21 as a mask. Thus, the tilt structure film 7 composed of the second material film 19 is formed (FIG. 2A) on the upper surface of the shaft section 13b and the upper surface of the sacrificial film 17.

Figure 2A:
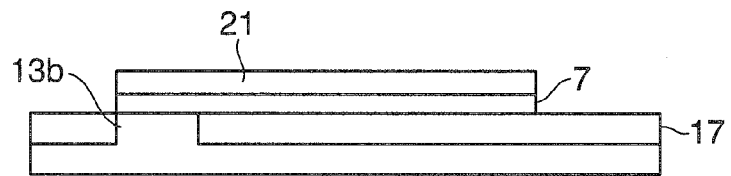
FIGS. 2A through 2E are cross-sectional diagrams showing the method of manufacturing the tilt structure according to the first embodiment.
Figure 2B:

Subsequently, the resist film 21 is removed (FIG. 2B).

Figure 2C:
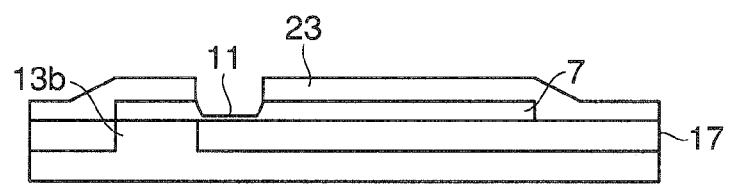

Then, a resist film 23 is formed on the tilt structure film 7 and the sacrificial film 17, and the etching process is performed on the tilt structure film 7 using the resist film 23 as a mask. Specifically, the tilt structure film 7 located on the corner section composed of the upper surface of the shaft section 13b and a side surface of the shaft section 13b is worked to have a thin film thickness (FIG. 2C). Thus, a hinge section 11, which is a thin film section located above the corner section described above, is provided to the tilt structure film 7. It should be noted that the hinge section 11 can also be formed at a position adjacent to the corner section.

Figure 2D:

Subsequently, the resist film 23 is removed (FIG. 2D).

Then, by removing the sacrificial film 17 using wet etching or dry etching, a space is formed (FIG. 2E) between the tilt structure film 7 and the substrate section 13a. The tilt structure film 7 on this occasion is in a condition of being linked to the shaft section 13b with the hinge section 11 formed to have a small thickness. Therefore, the tilt structure film 7 is arranged to be easy to bend at the linking section between the shaft section 13b and the hinge section 11.

Figure 3A:
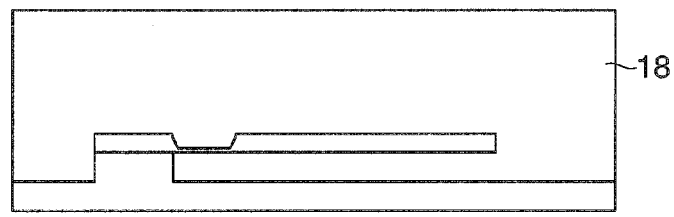
FIGS. 3A through 3C are cross-sectional diagrams showing the method of manufacturing the tilt structure according to the first embodiment.

Subsequently, the space above the substrate section 13a and the tilt structure film 7, and the space between the tilt structure film 7 and the substrate section 13a are supplied with a fluid 18 (FIG. 3A).

Then, by removing the fluid 18, the fluid 18 remains (FIG. 3B) between the tilt structure film 7 and the substrate section 13a. Since it is preferable to use the fluid 18 with a high surface tension in order for make the fluid 18 remain between the tilt structure film 7 and the substrate section 13a, it is preferable to use, for example, water as the fluid 18.

Subsequently, the fluid 18 left between the tilt structure film 7 and the substrate section 13a is dried to be removed to thereby cause sticking. As a result, the tilt structure film 7 is bent at the hinge section 11, and the end portion of the tilt structure film 7 is bonded to the substrate section 13a, and thus an acute angle is formed by the substrate section 13a and the tilt structure film 7. In other words, the tilt structure film 7 can be tilted (FIG. 3C) at a predetermined angle with respect to the surface of the substrate section 13a. On this occasion, since the thickness of the hinge section 11 of the tilt structure film 7 is set thinner, the tilt structure film 7 can be prevented from being deflected or curved. In other words, if the hinge section 11 of the tilt structure film 7 is made thicker, it becomes easy for the tilt structure film 7 to be curved when the sticking is caused.

By controlling the length of the tilt structure film 7 and the height of the shaft section 13b, it is possible to accurately form the angle between the tilt structure film 7 and the substrate section 13a so as to be a predetermined angle.

It should be noted that if an etching selection ratio with the sacrificial film 17 can be provided to the second material film 19 forming the tilt structure film 7, various materials can be used for the tilt structure film 7 and the sacrificial film 17, and further, it is possible to provide a spectral function (a thin film laminated structure) and a reflection function described later to the tilt structure film itself.

As the shaft section material, the substrate material, the second material film 19 forming the tilt structure, the sacrificial film 17, and a sacrificial film remover, the combinations 1 through 7 shown in Table 1 can be used.

TABLE 1

| | COMBINATION 1 | COMBINATION 2 | COMBINATION 3 | COMBINATION 4 | COMBINATION 5 | COMBINATION 6 | COMBINATION 7 |
|---|---|---|---|---|---|---|---|
| SUBSTRATE MATERIAL | poly-Si | poly-Si | $Si_3N_4$ | $SiO_2$ | poly-Si | $SiO_2$ | $SiO_2$, Al |

TABLE 1-continued

|  | COMBINATION 1 | COMBINATION 2 | COMBINATION 3 | COMBINATION 4 | COMBINATION 5 | COMBINATION 6 | COMBINATION 7 |
| --- | --- | --- | --- | --- | --- | --- | --- |
| SHAFT SECTION MATERIAL | poly-Si | poly-Si | $Si_3N_4$ | $SiO_2$ | poly-Si | $SiO_2$ | $SiO_2$, Al |
| TILT STRUCTURE MATERIAL | poly-Si | poly-Si | $Si_3N_4$ | $SiO_2$ | poly-Si | $SiO_2$ | $SiO_2$, Al |
| SACRIFICIAL FILM | PSG, $SiO_2$ | $SiO_2$ | poly-Si | poly-Si | Ge | Al | RESIST |
| SACRIFICIAL FILM REMOVER | HF | HF | TMAH*, KOH, EDP*, HF + $HNO_3$ + $CH_3COOH$ | $XeF_2$, $SF_6$ | $H_2O_2$ | HCl + $H_2O_2$ | $O_2$ |

*TMAH: tetramethylammonium hydroxide
*EDP: ethylenediamine pyrocatechol

According to the present embodiment, by using the semiconductor process, it becomes possible to easily manufacture a minute tilt structure at low cost.

Further, according to the present embodiment, the following advantages can be obtained compared to the related art. (1) Since the mask manufacturing cost is smaller than the metal mold manufacturing cost, the initial investment becomes small, and thus the manufacturing cost of the tilt structure can be reduced. (2) Since the mask is used in a contactless manner, the mask is not worn so much as the metal mold. Therefore, the running cost can be reduced. (3) Since it is possible to cope with the change in geometry in the length direction (a lateral direction) of the tilt structure film 7 by manufacturing a new mask, and the change in geometry in the height direction (a vertical direction) of the shaft section 13b by the etching process or the change in deposition condition, the cost and time with respect to the change in geometry can be reduced. (4) There is no limitation of the material of the tilt structure film providing the material can be used in the semiconductor process. (5) Since the tilt structure is manufactured using the semiconductor processing technology, the miniaturization of the tilt structure is easy. (6) It is easy to integrate the tilt structure with an semiconductor element, and a desired tilt structure can be manufactured for each element.

2. Second Embodiment

FIGS. 4 and 5 are cross-sectional views showing a method of manufacturing a tilt structure according to a second embodiment of the invention, wherein the same sections as in the first embodiment are denoted with the same symbols, and the explanation for the same sections will be omitted.

Firstly, the processes shown in FIGS. 1A through 1E are performed in substantially the same manner as in the first embodiment.

Then, a thin film 25 made of a hinge material is deposited (FIG. 4A) on the upper surface of the shaft section 13b and the upper surface of the sacrificial film 17.

Then, the second material film 19, which forms the tilt structure film, is deposited (FIG. 4B) on the thin film 25.

Subsequently, a resist film 29 is formed on the second material film 19, and the etching process is performed on the second material film 19 and the thin film using the resist film 29 as a mask. Thus, the sacrificial film 17 is exposed (FIG. 4C) while leaving the thin film on the upper surface of the shaft section 13b and the upper surface of the sacrificial film 17.

Subsequently, the resist film 29 is removed, a resist film 31 is formed on the second material film 19, and the etching process is performed on the second material film 19 using the resist film 31 as a mask. It is also possible to form the resist film 31 by re-exposing the resist film 29 without removing the resist film 29. Thus, by removing the second material film 19 located on the corner section composed of the upper surface of the shaft section 13b and the side surface of the shaft section 13b, the thin film 25 located on the corner section described above is exposed, and then the tilt structure film 7 formed of the second material film 19 is formed (FIG. 4D) on the thin film 25.

Figure 4A:
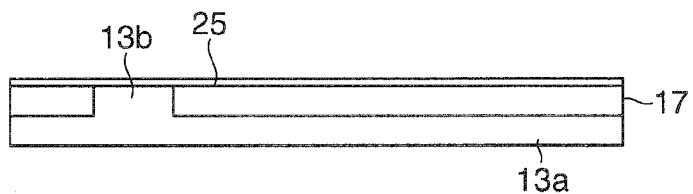
FIGS. 4A through 4E are cross-sectional diagrams showing a method of manufacturing a tilt structure according to a second embodiment.
Figure 4B:
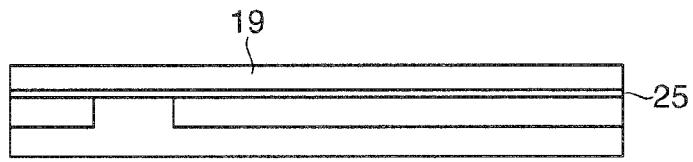
Figure 4C:
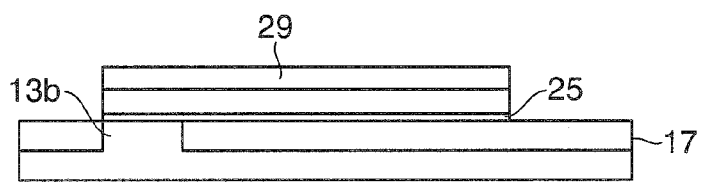
Figure 4D:
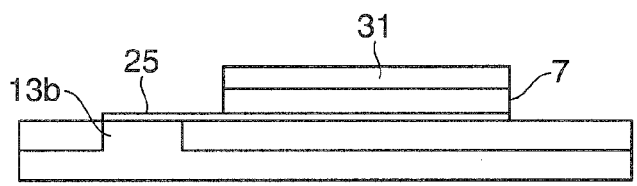
Figure 4E:
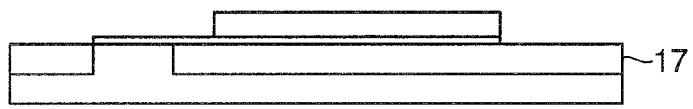

Subsequently, the resist film 31 is removed (FIG. 4E).

Figure 2E:
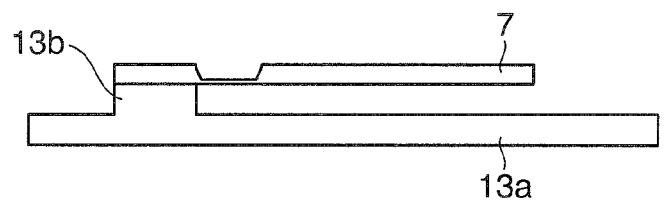
Figure 5A:
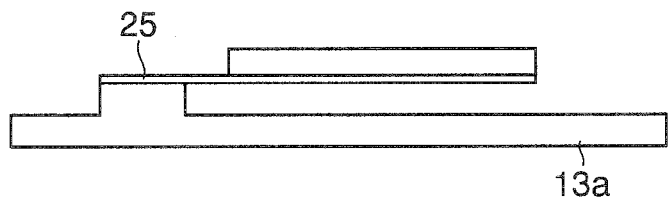
FIGS. 5A through 5D are cross-sectional diagrams showing the method of manufacturing the tilt structure according to the second embodiment.

Then, similarly to the process shown in FIG. 2E, the sacrificial film 17 between the thin film 25 and the substrate section 13a is removed by wet etching or dry etching (FIG. 5A).

Figure 5B:
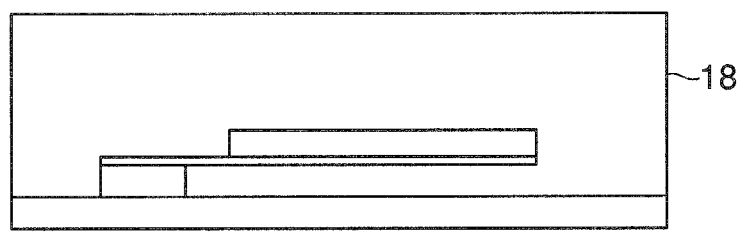
Figure 5C:
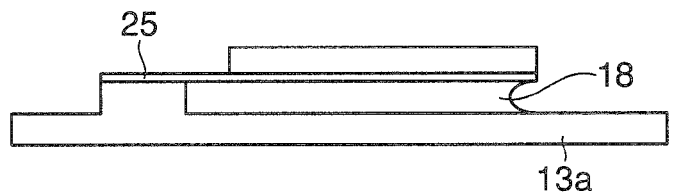
Figure 5D:
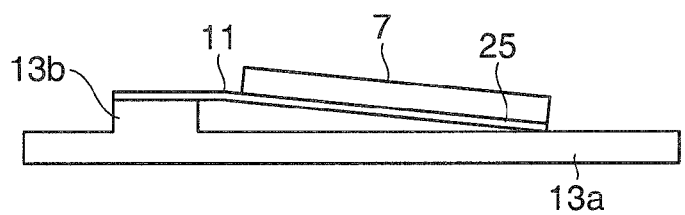

Subsequently, similarly to the process shown in FIG. 3A, the fluid 18 is supplied (FIG. 5B).

Figure 3B:

Then, by removing the fluid 18 similarly to the process shown in FIG. 3B, the fluid 18 remains (FIG. 5C) between the thin film 25 and the substrate section 13a.

Figure 3C:
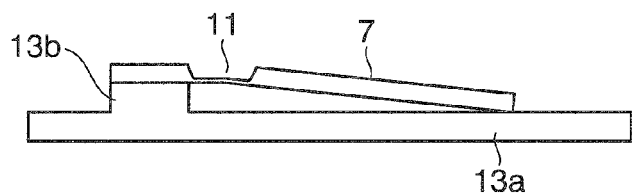

Then, similarly to the process shown in FIG. 3C, by drying to remove the fluid 18 left between the thin film 25 and the substrate section 13a, sticking is caused. As a result, the thin film 25 is bent at the corner section described above, and the end portion of the thin film 25 is bonded to the substrate section 13a, and thus an acute angle is formed by the substrate section 13a and both of the thin film 25 and the tilt structure film 7. In other words, the tilt structure film 7 can be tilted (FIG. 5D) at a predetermined angle with respect to the surface of the substrate section 13a. It should be noted that the thin film 25 on the corner section described above corresponds to the hinge section 11.

By controlling the length of each of the tilt structure film 7 and the thin film section 25, and the height of the shaft section 13b, it is possible to accurately form the angle between both of the tilt structure film 7 and the thin film section 25, and the substrate section 13a so as to be a desired angle.

According also to the present embodiment, substantially the same advantages as in the first embodiment can be obtained.

3. Third Embodiment

FIGS. 6 and 7 are cross-sectional views showing a method of manufacturing a tilt structure according to a third embodiment of the invention. This method of manufacturing the tilt structure is a method of applying a semiconductor process technology to thereby make it easy to achieve low cost and miniaturization.

Firstly, a first material film 33, which becomes a substrate material and a hinge material, is deposited (FIG. 6A) on a base member (not shown).

Subsequently, a resist film 32 is formed on the first material film 33, and an etching process is performed on the first material film 33 using the resist film 32 as a mask to thereby form (FIG. 6B) a narrow shaft section 33b as a hinge section on a substrate section 33a.

Figure 6A:
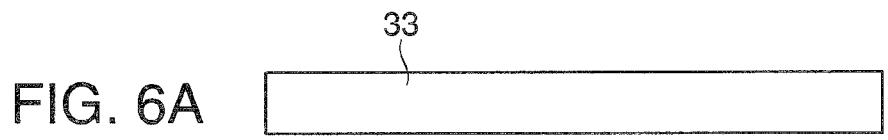
FIGS. 6A through 6F are cross-sectional diagrams showing a method of manufacturing a tilt structure according to a third embodiment.
Figure 6B:
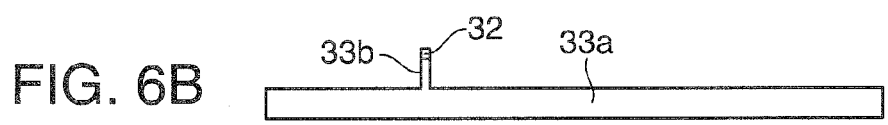
Figure 6C:
Figure 6D:
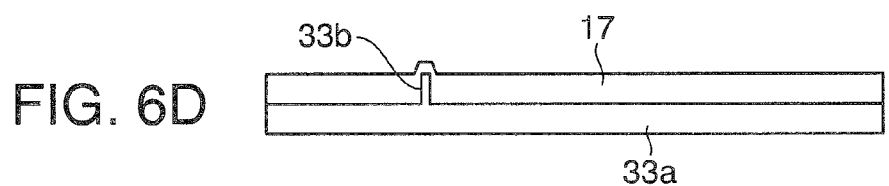

Subsequently, the resist film 32 is removed (FIG. 6C).

Then, the sacrificial film 17 is deposited (FIG. 6D) on the substrate section 33a and the narrow shaft section 33b.

Figure 6E:
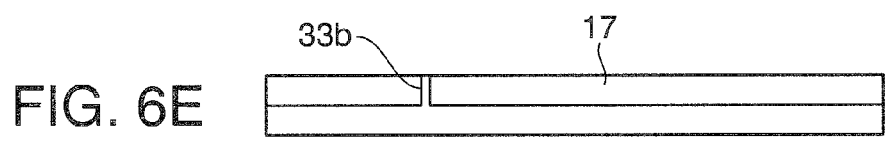
Figure 6F:
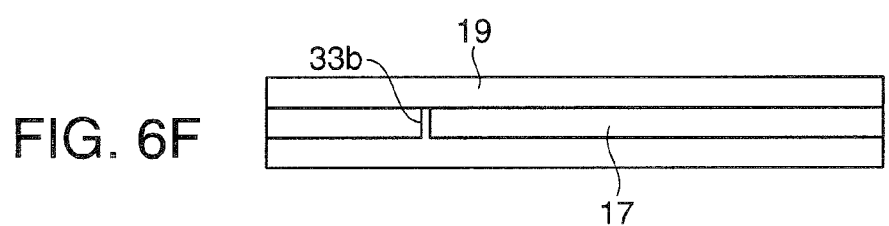

Subsequently, the sacrificial film 17 is planarized by CMP to thereby expose the upper surface of the narrow shaft section 33b, and form the sacrificial film 17, which has the upper surface continuous to the upper surface of the narrow shaft section 33b, on the substrate section 33a (FIG. 6E). It should be noted that if the sacrificial film 17 can be formed in the condition shown in FIG. 6E only by applying it on the substrate section 33a and the narrow shaft section 33b, the process of planarizing it by CMP is unnecessary. As such a sacrificial film 17, it is possible to adopt, for example, an SOG film, an organic film, and a resist film.

Then, the second material film 19, which forms the tilt structure film, is deposited (FIG. 6F) on the upper surface of the narrow shaft section 33b and the upper surface of the sacrificial film 17. The second material film 19 had a film thickness larger than the width of the narrow shaft section 33b.

Subsequently, a resist film 39 is formed on the second material film 19, and the etching process is performed on the second material film 19 using the resist film 39 as a mask. Thus, the tilt structure film 7 composed of the second material film 19 is formed (FIG. 7A) on the upper surface of the narrow shaft section 33b and the upper surface of the sacrificial film 17.

Figure 7A:
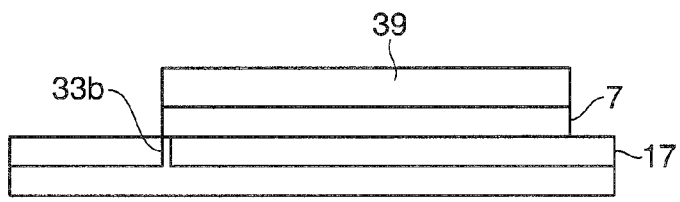
FIGS. 7A through 7F are cross-sectional diagrams showing the method of manufacturing the tilt structure according to the third embodiment.
Figure 7B:
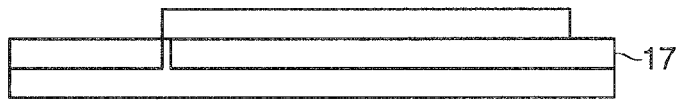
Figure 7C:
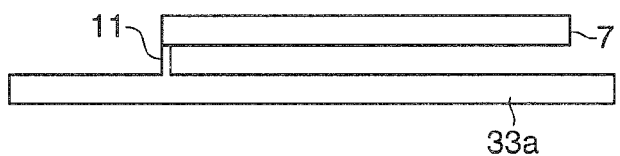

Subsequently, the resist film 39 is removed (FIG. 7B).

Then, by removing the sacrificial film 17 using wet etching or dry etching, a space is formed (FIG. 7C) between the tilt structure film 7 and the substrate section 33a. The tilt structure film 7 on this occasion is in a condition of being held to the substrate section 33a by the narrow shaft section 33b as the hinge section 11 formed to have a small thickness. Therefore, the hinge section 11 is arranged to bend easily.

Figure 7D:
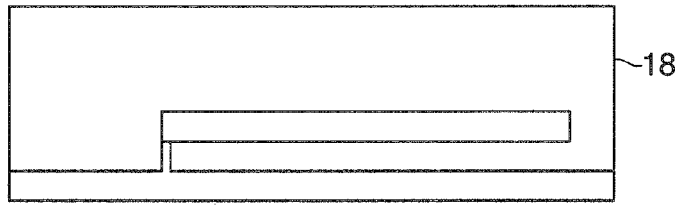
Figure 7E:
Figure 7F:
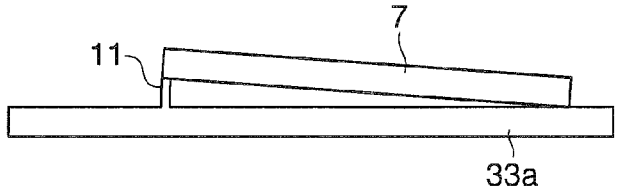

Subsequently, the space above the substrate section 33a and the tilt structure film 7, and the space between the tilt structure film 7 and the substrate section 33a are supplied with the fluid 18 (FIG. 7D).

Then, by removing the fluid 18, the fluid 18 remains (FIG. 7E) between the tilt structure film 7 and the substrate section 33a. Since it is preferable to use the fluid 18 with a high surface tension in order for make the fluid 18 remain between the tilt structure film 7 and the substrate section 33a, it is preferable to use, for example, water as the fluid 18.

Subsequently, the fluid 18 left between the tilt structure film 7 and the substrate section 33a is dried to be removed to thereby cause sticking. As a result, the hinge section 11 as the narrow shaft section is bent, and the end portion of the tilt structure film 7 is bonded to the substrate section 33a, and thus an acute angle is formed by the substrate section 33a and the tilt structure film 7. In other words, the tilt structure film 7 can be tilted (FIG. 7F) at a predetermined angle with respect to the surface of the substrate section 33a. On this occasion, since the thickness of the hinge section 11 is set thinner, the tilt structure film 7 can be prevented from being deflected or curved.

By controlling the length of the tilt structure film 7 and the height of the hinge section 11, it is possible to accurately form the angle between the tilt structure film 7 and the substrate section 33a so as to be a desired angle.

It should be noted that if an etching selection ratio with the sacrificial film 17 can be provided to the second material film 19 forming the tilt structure film 7, various materials can be used for the tilt structure film 7 and the sacrificial film 17, and further, it is possible to provide a spectral function (a thin film laminated structure) and a reflection function described later to the tilt structure film itself.

According also to the present embodiment, substantially the same advantages as in the first embodiment can be obtained.

4. Fourth Embodiment

FIGS. 8 and 9 are cross-sectional views showing a method of manufacturing a tilt structure according to a fourth embodiment of the invention. This method of manufacturing the tilt structure is a method of applying a semiconductor process technology to thereby make it easy to achieve low cost and miniaturization.

Firstly, a first material film 45, which becomes a substrate material, a hinge material, and a bottom section material, is deposited (FIG. 8A) on a base member (not shown).

Subsequently, a resist film 46 is formed on the first material film 45, and an etching process is performed on the first material film 45 using the resist film 46 as a mask to thereby form (FIG. 8B) a narrow shaft section 45b as a hinge section and a bottom section 45c opposed to the narrow shaft section 45b on a substrate section 45a.

Figure 8A:
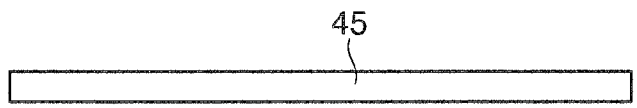
FIGS. 8A through 8F are cross-sectional diagrams showing a method of manufacturing a tilt structure according to a fourth embodiment.
Figure 8B:
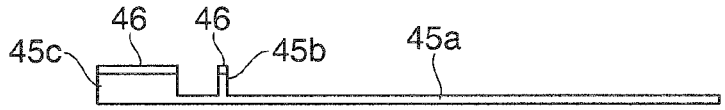
Figure 8C:
Figure 8D:

Subsequently, the resist film 46 is removed (FIG. 8C).

Then, the sacrificial film 17 is deposited (FIG. 8D) on the substrate section 45a, the narrow shaft section 45b, and the bottom section 45c.

Figure 8E:
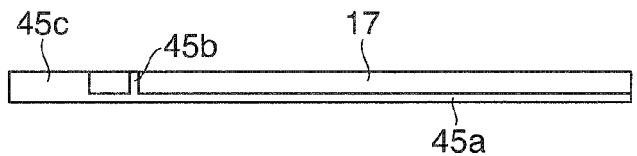
Figure 8F:
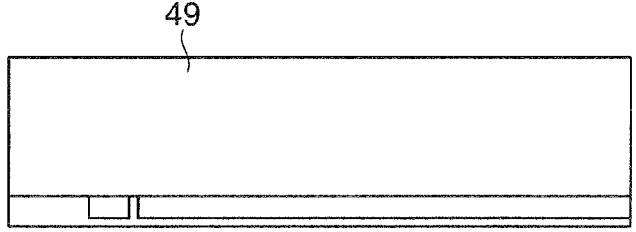

Subsequently, the sacrificial film 17 is planarized by CMP to thereby expose the upper surface of each of the narrow shaft section 45b and the bottom section 45c, and thus form the sacrificial film 17, which has the upper surface continuous to the upper surface of each of the narrow shaft section 45b and the bottom section 45c, on the substrate section 45a (FIG. 8E). It should be noted that if the sacrificial film 17 can be formed in the condition shown in FIG. 8E only by applying it on the substrate section 45a, the narrow shaft section 45b, and the bottom section 45c, the process of planarizing it by CMP is unnecessary. As such a sacrificial film 17, it is possible to adopt, for example, an SOG film, an organic film, and a resist film.

Then, the second material film 49, which forms the tilt structure film and a base section, is deposited (FIG. 8F) on the respective upper surfaces of the narrow shaft section 45b and the bottom section 45c, and the upper surface of the sacrificial film 17.

Subsequently, a resist film 51 is formed on the second material film 49, and the etching process is performed on the second material film 49 using the resist film 51 as a mask. Thus, the tilt structure film 7 having a width larger than the width of the narrow shaft section 45b is formed on the upper surface of the narrow shaft section 45b and the upper surface of the sacrificial film 17, and at the same time, the base section 49a opposed to the tilt structure film 7 is formed (FIG. 9A) on the upper surface of the bottom section 45c.

Subsequently, the resist film 51 is removed (FIG. 93).

Then, by removing the sacrificial film 17 using wet etching or dry etching, spaces are respectively formed (FIG. 9C) between the narrow shaft section 45b and the bottom section 45c, and between the tilt structure film 7 and the substrate section 45a. The tilt structure film 7 on this occasion is in a condition of being held to the substrate section 45a by the narrow shaft section 45b as the hinge section formed to have a small width. Therefore, the narrow shaft section 45b is arranged to bend easily.

Figure 9A:
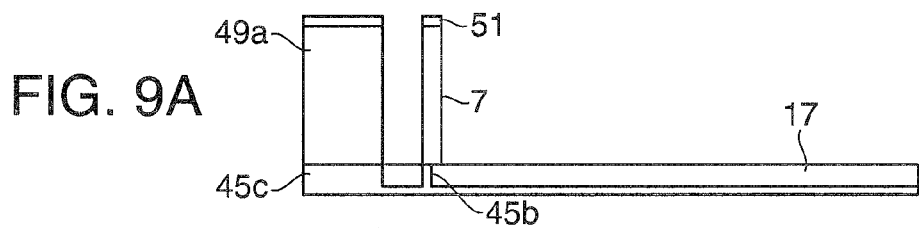
FIGS. 9A through 9F are cross-sectional diagrams showing the method of manufacturing the tilt structure according to the fourth embodiment.
Figure 9B:
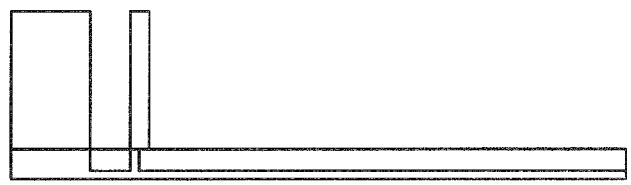
Figure 9C:
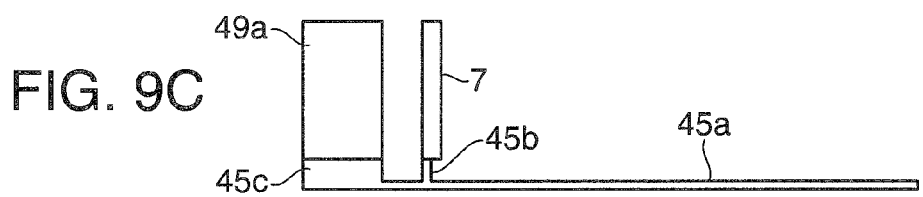
Figure 9D:
Figure 9E:
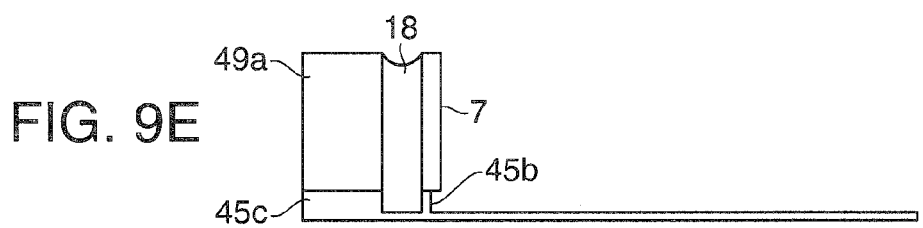
Figure 9F:
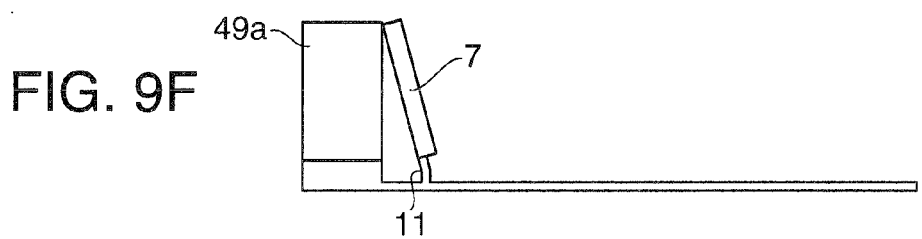

Subsequently, the space above the substrate section 45a and the tilt structure film 7, the space between the tilt structure film 7 and the substrate section 45a, the space between the tilt structure film 7 and the base section 49a, and the space between the narrow shaft section 45b and the bottom section 45c are supplied with the fluid 18 (FIG. 9D).

Then, by removing the fluid 18, the fluid 18 remains (FIG. 7E) between the tilt structure film 7 and the base section 49a, and between the narrow shaft section 45b and the bottom section 45c. Since it is preferable to use the fluid 18 with a high surface tension in order for make the fluid 18 remain between the tilt structure film 7 and the base section 49a, it is preferable to use, for example, water as the fluid 18.

Subsequently, the fluid 18 left between the tilt structure film 7 and the base section 49a is dried to be removed to thereby cause sticking. As a result, the hinge section 11 as the narrow shaft section is bent, and the upper portion of the tilt structure film 7 is bonded to the base section 49a, and thus an acute angle is formed by the base section 49a and the tilt structure film 7. In other words, the tilt structure film 7 can be tilted (FIG. 9F) at a predetermined angle with respect to the surface of the base section 49a. On this occasion, since the width of the hinge section 11 is set smaller, the tilt structure film 7 can be prevented from being deflected or curved.

By controlling the length of the tilt structure film 7 and the distance between the tilt structure film 7 and the base section 49a, it is possible to accurately form the angle between the tilt structure film 7 and the base section 49a so as to be a desired angle.

It should be noted that if an etching selection ratio with the sacrificial film 17 can be provided to the second material film 49 forming the tilt structure film 7, various materials can be used for the tilt structure film 7 and the sacrificial film 17, and further, it is possible to provide a spectral function (a thin film laminated structure) and a reflection function described later to the tilt structure film itself.

According also to the present embodiment, substantially the same advantages as in the first embodiment can be obtained.

5. Fifth Embodiment

Figure 10:
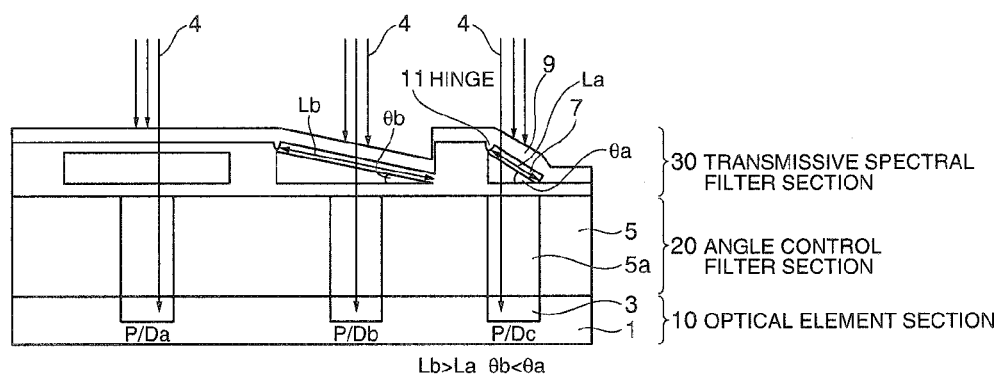
FIG. 10 is a schematic diagram showing a spectral sensor according to a fifth embodiment of the invention.

FIG. 10 is a schematic diagram showing a spectral sensor according to a fifth embodiment of the invention.

The spectral sensor shown in FIG. 10 is provided with an optical element section 10 having light receiving elements, an angle control filter section 20, and a transmissive spectral filter section 30.

An electronic circuit (not shown), which applies a predetermined reverse bias voltage to a light receiving element having a photodiode 3, and detects the current based on the photovoltaic power generated in the light receiving element and then amplifies an analog signal corresponding to the amount of the current to convert it into a digital signal, is provided to a semiconductor substrate 1 provided with the optical element section 10.

<5-1. Angle Control Filter Section 20>

An angle limiting filter 5 is formed on the semiconductor substrate 3 provided with photodiodes 3. In the angle limiting filter 5 of the present embodiment, light path wall sections are formed of a light blocking body, and there are formed light paths 5a surrounded by the light path wall sections. The light blocking body is made of a material, which does not substantially transmit the light having the wavelength to be received by the photodiodes 3, and is continuously formed through a plurality of layers with a predetermined pattern of, for example, a grid on the semiconductor substrate 1 to thereby form the light paths 5a in the stacking direction of the light blocking body.

The incident angle of the light passing through the light path is limited by the light path wall section formed of the light blocking body. Specifically, in the case in which the light entering the light path is tilted at an angle equal to or larger than a predetermined limit angle with respect to the direction of the light path, the light hits against the light blocking body and is partially absorbed by the light blocking body, and the remainder is reflected. Since the reflected light becomes weak due to the repeated reflection occurring until the light finishes passing through the light path, the light allowed to pass through the angle limiting filter 5 is substantially limited to the light with the tilt with respect to the light path at an angle smaller than the predetermined limit angle.

In the areas surrounded by the light blocking body, there are formed silicon oxide and so on having a light transmissive property (denoting the light transmissive property with respect to the light having the wavelength to be received by the photodiode 3).

In the aspect described above, since the light path wall sections are formed by forming the light blocking body through plural layers with the predetermined grid pattern on the semiconductor substrate 1 using the semiconductor processing technology, it is possible to form a fine pattern, and it becomes possible to manufacture a small-sized angle limiting filter. Further, it becomes also possible to simplify the manufacturing process and to prevent reduction of transmitted light due to a bonding material in comparison with the case of forming the spectral sensor by bonding the members.

<5-2. Transmissive Spectral Filter Section 30>

The transmissive spectral filter section 30 has a dispersion laminate thin film 9 formed on the angle limiting filter 5. The dispersion laminate thin film 9 is obtained by laminating a number of layers of thin films with a low refractive index such as silicon oxide ($SiO_2$) and thin films with a high refractive index such as titanium oxide ($TiO_2$) with a slight tilt with respect to the semiconductor substrate 1.

The thin films with a low refractive index and the thin films with a high refractive index are each arranged to have, for example, a predetermined sub-micron film thickness, and are formed to have the overall thickness of, for example, about 6 µm by stacking them in totally 60 layers, for example.

The respective tilt angles $\theta_a$ and $\theta_b$ of the thin films with a low refractive index and the thin films with a high refractive index with respect to the semiconductor substrate 1 are set to, for example, not smaller than 0[deg] and not larger than 30[deg] in accordance with the set wavelength of the light intended to be received by the photodiode 3.

In order for tilting the thin films with a low refractive index and the thin films with a high refractive index with respect to the semiconductor substrate 1, the tilt structure film 7 having a light transmissive property, for example, is formed on the angle limiting filter 5, and then the thin films with a low refractive index and the thin films with a high refractive index are deposited on the tilt structure film 7. As the tilt structure film 7, what is manufactured by the method of manufacturing the tilt structure of each of the first through fourth embodiments described above can be used. It should be noted that although in the present embodiment the dispersion laminate thin film 9 is formed on the tilt structure film 7, this is not a limitation, but it is also possible to use the tilt structure film 7 itself formed as the dispersion laminate thin film 9. Further, the tilt structure film 7 is not used for the transmissive spectral filter section 30 for the incident light 4 input to the photodiode P/Da.

As described above, by previously forming the tilt structure films 7 having the tilt angles $\theta_a$ and $\theta_b$ different from each other in accordance with the set wavelength of the light intended to be received by the photodiode 3, the thin films with a low refractive index and the thin films with a high refractive index can be deposited by a common process with the same thickness independently of the set wavelength of the light intended to be received by the photodiode 3.

According to the configuration described above, the transmissive spectral filter section 30 limits the wavelength of the light 4 entering the angle limiting filter 5 at an angle within a predetermined limit angle range.

Specifically, the incident light entering the transmissive spectral filter section 30 partially becomes the reflected light and partially becomes the transmitted light on the interface between the thin film with a low refractive index and the thin film with a high refractive index. Further, a part of the reflected light is reflected again on the interface between another thin film with a low refractive index and another thin film with a high refractive index, and is combined with the transmitted light described above. On this occasion, regarding the light with the wavelength equal to the light path length of the reflected light, the reflected light and the transmitted light are in-phase with each other to reinforce each other, while regarding the light with the wavelength different from the light path length of the reflected light, the phases of the reflected light and the transmitted light are not in-phase with each other to attenuate (interfere) each other.

Here, the light path length of the reflected light is determined in accordance with the tilt angles of the thin film with a low refractive index and the tilt angle of the thin film with a high refractive index with respect to the direction of the incident light. Therefore, if the interferential action described above is repeated in the totally 60 layers of the thin films with a low refractive index and the thin films with a high refractive index, only the light with the specified wavelength is transmitted through the transmissive spectral filter section 30, and is then emitted from the transmissive spectral filter section 30 at a predetermined exit angle (e.g., the angle equal to the incident angle to the transmissive spectral filter section 30) in accordance with the incident angle of the incident light.

The angle limiting filter 5 transmits only the light entering the angle limiting filter 5 at an angle within the predetermined limit angle range. Therefore, the wavelength of the light transmitted through the transmissive spectral filter section 30 and the angle control filter section 20 is limited to the wavelength within the predetermined range determined in accordance with the tilt angles $\theta_a$ and $\theta_b$ of the thin films with a low refractive index and the thin films with a high refractive index with respect to the semiconductor substrate 1 and the limit angle range of the incident light transmitted by the angle control filter section 20.

<5-3. Optical Element Section 10>

The optical element section 10 is an element for receiving the light transmitted through the transmissive spectral filter section 30 and the angle control filter section 20, and converting it into photovoltaic power.

FIG. 10 shows the photodiode P/Dc for receiving the light with the wavelength determined by the tilt angle $\theta_a$ of the transmissive spectral filter section 30, the photodiode P/Db for receiving the light with the wavelength determined by the tilt angle $\theta_b$, and the photodiode P/Da for receiving the light with the wavelength determined by the tilt angle 0°.

The photodiode includes various semiconductor areas provided to the semiconductor substrate 1 by ion injection or the like.

The light transmitted through the angle control filter section 20 is received by the photodiode and the photovoltaic power is generated, thereby generating the current. By detecting the current with the electronic circuit (not shown), the light received by the photodiode can be detected.

<5-4. Manufacturing Method of Fifth Embodiment>

Here, the method of manufacturing the spectral sensor according to the fifth embodiment will briefly be explained. The spectral sensor is manufactured by firstly providing the photodiodes 3 to the semiconductor substrate 1, then forming the angle control filter section 20 on the photodiodes 3, and then forming the transmissive spectral filter section 30 on the angle control filter section 20.

According to the present embodiment, the manufacture can be performed by the semiconductor process from the beginning to the end, and the transmissive spectral filter section using the desired tilt structure for each of the elements (photodiodes) can be formed.

6. Sixth Embodiment

Figure 11:
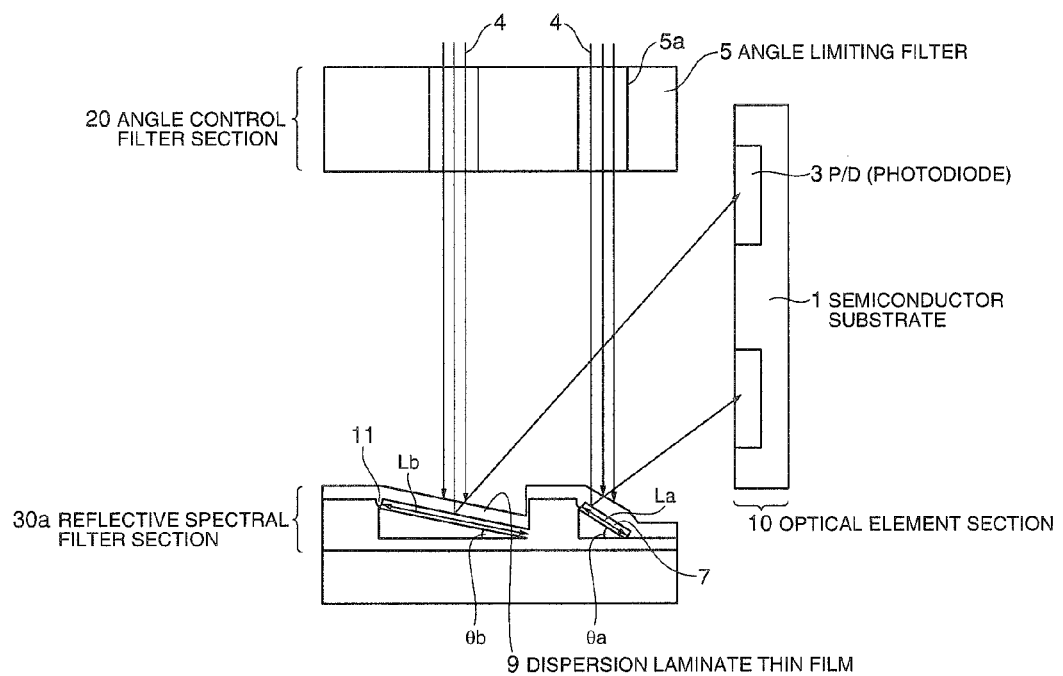
FIG. 11 is a schematic diagram showing a spectral sensor according to a sixth embodiment of the invention.

FIG. 11 is a schematic diagram showing a spectral sensor according to the sixth embodiment of the invention, wherein the same sections as shown in FIG. 10 are denoted with the same symbols, and the different sections will only be explained.

The spectral sensor shown in FIG. 11 is provided with the optical element section 10 having light receiving elements, the angle control filter section 20, and a reflective spectral filter section 30a.

<6-1. Angle Control Filter Section 20>

The angle control filter section 20 is formed above the reflective spectral filter section 30a. It is also possible for the angle control filter section 20 to be formed distantly from the reflective spectral filter section 30a, or to be formed in contact therewith.

<6-2. Reflective Spectral Filter Section 30a>

The reflective spectral filter section 30a has the dispersion laminate thin film 9 formed on the tilt structure film 7.

The reflective spectral filter section 30a limits the wavelength of the light 4 emitted from the angle limiting filter 5 at an angle within a predetermined limit angle range.

Only the light with a specified wavelength is reflected by the reflective spectral filter section 30a in accordance with the incident angle of the incident light, and is emitted from the reflective spectral filter section 30 at a predetermined exit angle.

The wavelength of the light transmitted through the reflective spectral filter section 30a and the angle control filter section 20 is limited to the wavelength within the predetermined range determined in accordance with the tilt angles $\theta_a$ and $\theta_b$ of the thin films with a low refractive index and the thin films with a high refractive index and the limit angle range of the incident light transmitted by the angle control filter section 20.

<6-3. Optical Element Section 10>

The optical element section 10 is an element for receiving the light transmitted through the angle control filter section 20, and then reflected by the reflective spectral filter section 30a, and converting it into photovoltaic power.

FIG. 11 shows a photodiode for receiving the light with the wavelength determined by the tilt angle $\theta_a$ of the reflective spectral filter section 30*a*, and a photodiode for receiving the light with the wavelength determined by the tilt angle $\theta_b$.

DESCRIPTION OF REFERENCE NUMERALS AND SIGNS

1 semiconductor substrate
3 photodiode
5 angle limiting filter
5*a* light path
7 tilt structure film
9 dispersion laminate thin film
11 hinge section
13 first material film
13*a* substrate section
13*b* shaft section
17 sacrificial film
18 fluid
19 second material film
20 angle control filter section
25 thin film
30 transmissive spectral filter section
30*a* reflective spectral filter section
33 first material film
33*a* substrate section
33*b* narrow shaft section
45 first material film
45*a* substrate section
45*b* narrow shaft section
45*c* bottom section
49 second material film
49*a* base section

[Description of Reference Numerals and Signs]

| | |
|---|---|
| 1 | semiconductor substrate |
| 3 | photodiode |
| 5 | angle limiting filter |
| 5a | light path |
| 7 | tilt structure film |
| 9 | dispersion laminate thin film |
| 11 | hinge section |
| 13 | first material film |
| 13a | substrate section |
| 13b | shaft section |
| 17 | sacrificial film |
| 18 | fluid |
| 19 | second material film |
| 20 | angle control filter section |
| 25 | thin film |
| 30 | transmissive spectral filter section |
| 30a | reflective spectral filter section |
| 33 | first material film |
| 33a | substrate section |
| 33b | narrow shaft section |
| 45 | first material film |
| 45a | substrate section |
| 45b | narrow shaft section |
| 45c | bottom section |
| 49 | second material film |
| 49a | base section |

The invention claimed is:
1. A tilt structure comprising:
a shaft section formed on a substrate section;
a thin film having one end formed on an upper surface of the shaft section, and the other end bonded to the substrate section; and
a tilt structure film formed on the thin film, and having a film thickness thicker than the thin film,
wherein the tilt structure film is formed on the other end of the thin film instead of a corner section composed of the upper surface of the shaft section and a side surface of the shaft section,
the thin film is bent on the corner section, and
an acute angle is formed by the substrate section and both of the thin film and the tilt structure film.

* * * * *